(12) United States Patent
Liu et al.

(10) Patent No.: US 10,475,745 B2
(45) Date of Patent: *Nov. 12, 2019

(54) BRIDGE INTERCONNECTION WITH LAYERED INTERCONNECT STRUCTURES

(71) Applicant: INTEL CORPORATION, Santa Clara, CA (US)

(72) Inventors: Yueli Liu, Gilbert, AZ (US); Qinglei Zhang, Chandler, AZ (US); Amanda E. Schuckman, Scottsdale, AZ (US); Rui Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/129,577

(22) Filed: Sep. 12, 2018

(65) Prior Publication Data

US 2019/0013271 A1  Jan. 10, 2019

Related U.S. Application Data

(60) Continuation of application No. 15/478,858, filed on Apr. 4, 2017, now Pat. No. 10,103,103, which is a (Continued)

(51) Int. Cl.
*H01L 23/538* (2006.01)
*H01L 23/00* (2006.01)
(Continued)

(52) U.S. Cl.
CPC ...... *H01L 23/5381* (2013.01); *H01L 23/4821* (2013.01); *H01L 23/538* (2013.01);
(Continued)

(58) Field of Classification Search
CPC .............. H01L 23/5381; H01L 23/538; H01L 23/53238; H01L 23/5386; H01L 23/5384;
(Continued)

(56) References Cited

U.S. PATENT DOCUMENTS 8,026,614 B2  9/2011  Kawabata et al.
8,872,349 B2  10/2014  Chiu et al.
(Continued)

FOREIGN PATENT DOCUMENTS

KR  10-2011-0118948 A  11/2011
KR  10-1131230 B1  3/2012

OTHER PUBLICATIONS

Office Action dated Feb. 23, 2015, issued in corresponding German Patent Application No. 102014107514.5, 9 pages.
(Continued)

*Primary Examiner* — Joseph C. Nicely
(74) *Attorney, Agent, or Firm* — Schwabe, Williamson & Wyatt P.C.

(57) ABSTRACT

Embodiments of the present disclosure are directed towards techniques and configurations for layered interconnect structures for bridge interconnection in integrated circuit assemblies. In one embodiment, an apparatus may include a substrate and a bridge embedded in the substrate. The bridge may be configured to route electrical signals between two dies. An interconnect structure, electrically coupled with the bridge, may include a via structure including a first conductive material, a barrier layer including a second conductive material disposed on the via structure, and a solderable material including a third conductive material disposed on the barrier layer. The first conductive material, the second conductive material, and the third conductive material may have different chemical composition. Other embodiments may be described and/or claimed.

7 Claims, 10 Drawing Sheets

Related U.S. Application Data continuation of application No. 14/836,906, filed on Aug. 26, 2015, now Pat. No. 9,640,485, which is a division of application No. 13/903,828, filed on May 28, 2013, now Pat. No. 9,147,663.

(51) Int. Cl.

| | | |
|---|---|---|
| *H01L 23/482* | (2006.01) | |
| *H01L 25/065* | (2006.01) | |
| *H05K 1/18* | (2006.01) | |
| *H01L 23/532* | (2006.01) | |
| *H01L 25/18* | (2006.01) | |
| *H05K 3/34* | (2006.01) | |

(52) U.S. Cl.
  CPC ...... *H01L 23/5383* (2013.01); *H01L 23/5384* (2013.01); *H01L 23/5385* (2013.01); *H01L 23/5386* (2013.01); *H01L 23/53238* (2013.01); *H01L 24/09* (2013.01); *H01L 24/16* (2013.01); *H01L 24/17* (2013.01); *H01L 24/26* (2013.01); *H01L 24/27* (2013.01); *H01L 24/33* (2013.01); *H01L 24/81* (2013.01); *H01L 24/82* (2013.01); *H01L 25/0655* (2013.01); *H01L 25/18* (2013.01); *H05K 1/185* (2013.01); *H01L 24/13* (2013.01); *H01L 2224/0401* (2013.01); *H01L 2224/131* (2013.01); *H01L 2224/16235* (2013.01); *H01L 2224/16265* (2013.01); *H01L 2224/171* (2013.01); *H01L 2224/1703* (2013.01); *H01L 2224/2746* (2013.01); *H01L 2224/32225* (2013.01); *H01L 2224/3303* (2013.01); *H01L 2224/33505* (2013.01); *H01L 2224/73204* (2013.01); *H01L 2224/8147* (2013.01); *H01L 2224/81192* (2013.01); *H01L 2224/81193* (2013.01); *H01L 2224/81411* (2013.01); *H01L 2224/81455* (2013.01); *H01L 2224/81463* (2013.01); *H01L 2224/81466* (2013.01); *H01L 2224/81472* (2013.01); *H01L 2224/81479* (2013.01); *H01L 2224/81481* (2013.01); *H01L 2224/81484* (2013.01); *H01L 2224/81487* (2013.01); *H01L 2224/81815* (2013.01); *H01L 2924/00014* (2013.01); *H01L 2924/0103* (2013.01); *H01L 2924/0105* (2013.01); *H01L 2924/01028* (2013.01); *H01L 2924/01029* (2013.01); *H01L 2924/01047* (2013.01); *H01L 2924/01072* (2013.01); *H01L 2924/0496* (2013.01); *H01L 2924/12042* (2013.01); *H01L 2924/15192* (2013.01); *H01L 2924/15311* (2013.01); *H01L 2924/181* (2013.01); *H05K 3/3436* (2013.01); *H05K 2201/10363* (2013.01)

(58) Field of Classification Search
  CPC ............. H01L 23/5385; H01L 23/5383; H01L 23/4821; H01L 24/09
  See application file for complete search history.

(56) References Cited

U.S. PATENT DOCUMENTS

| 8,901,748 | B2 | 12/2014 | Manusharow et al. | |
|---|---|---|---|---|
| 8,916,981 | B2 | 12/2014 | Xiu et al. | |
| 8,946,900 | B2* | 2/2015 | Qian | H01L 23/49827 |
| | | | | 257/531 |
| 9,640,485 | B2* | 5/2017 | Liu | H01L 24/33 |
| 9,852,994 | B2 | 12/2017 | Haba | |
| 2005/0037601 | A1* | 2/2005 | Hsu | H01L 21/4846 |
| | | | | 438/612 |
| 2005/0056913 | A1 | 3/2005 | Farnworth | |
| 2006/0226527 | A1 | 10/2006 | Hatano et al. | |
| 2007/0237890 | A1* | 10/2007 | Sakai | G03F 7/033 |
| | | | | 427/98.4 |
| 2008/0038874 | A1* | 2/2008 | Lin | H01L 21/568 |
| | | | | 438/118 |
| 2008/0079163 | A1 | 4/2008 | Kurita et al. | |
| 2008/0224306 | A1 | 9/2008 | Yang | |
| 2009/0089466 | A1 | 4/2009 | Cunningham et al. | |
| 2009/0108427 | A1 | 4/2009 | Caron et al. | |
| 2009/0283898 | A1 | 11/2009 | Janzen et al. | |
| 2010/0140800 | A1* | 6/2010 | Hagihara | H01L 21/563 |
| | | | | 257/737 |
| 2010/0258944 | A1 | 10/2010 | Uchiyama et al. | |
| 2010/0327423 | A1 | 12/2010 | Braunisch et al. | |
| 2011/0089573 | A1 | 4/2011 | Kurita | |
| 2011/0068459 | A1 | 5/2011 | Pagaila et al. | |
| 2011/0169062 | A1 | 7/2011 | Kadoya | |
| 2011/0169150 | A1 | 7/2011 | Su et al. | |
| 2011/0233764 | A1 | 9/2011 | Chang et al. | |
| 2012/0161331 | A1 | 6/2012 | Gonzalez et al. | |
| 2012/0306080 | A1* | 12/2012 | Yu | H01L 23/147 |
| | | | | 257/751 |
| 2013/0093077 | A1 | 4/2013 | Liang et al. | |
| 2013/0168854 | A1 | 7/2013 | Karikalan et al. | |
| 2013/0200511 | A1 | 8/2013 | Banijamali | |
| 2014/0008786 | A1* | 1/2014 | Chen | H01L 23/3157 |
| | | | | 257/737 |
| 2014/0035093 | A1 | 2/2014 | Pincu et al. | |
| 2014/0117552 | A1* | 5/2014 | Qian | H04L 23/49827 |
| | | | | 257/762 |
| 2014/0174807 | A1 | 6/2014 | Roy et al. | |
| 2014/0248769 | A1 | 9/2014 | Sinha et al. | |
| 2014/0264933 | A1 | 9/2014 | Yu et al. | |
| 2015/0001685 | A1 | 1/2015 | Chung et al. | |
| 2015/0001717 | A1 | 1/2015 | Karhade et al. | |
| 2015/0028486 | A1 | 1/2015 | Liu et al. | |
| 2015/0035706 | A1 | 2/2015 | Darnell et al. | |
| 2015/0061162 | A1 | 3/2015 | Yu et al. | |
| 2015/0116965 | A1 | 4/2015 | Kim et al. | |
| 2017/0168235 | A1 | 6/2017 | Zhang et al. | |
| 2017/0213761 | A1 | 7/2017 | Tang et al. | |
| 2017/0309680 | A1 | 10/2017 | Kinney et al. | |

OTHER PUBLICATIONS

Notice of Preliminary Rejection without English Translation dated May 21, 2015, issued in corresponding Korean Patent Application No. 10-2014-0063501, 6 pages.

Non-Final Office Action dated Feb. 18, 2015 for U.S. Appl. No. 13/903,828, 37 pages.

Notice of Allowance dated Jun. 2, 2015 for U.S. Appl. No. 13/903,828, 11 pages.

Notice of Allowance dated Jul. 24, 2015 for U.S. Appl. No. 13/903,828, 6 pages.

Non-Final Office Action dated Mar. 30, 2016 for U.S. Appl. No. 14/836,906, 39 pages.

Final Office Action dated Oct. 3, 2016 for U.S. Appl. No. 14/836,906, 13 pages.

Notice of Allowance dated Dec. 30, 2016 for U.S. Appl. No. 14/836,906, 8 pages.

Notice of Preliminary Rejection dated Jan. 15, 2018, issued in corresponding Korean Patent Application No. 10-2016-0006273, 11 pages.

Non-Final Office Action dated Jul. 13, 2017 for U.S. Appl. No. 15/478,858, 15 pages.

Final Office Action dated Nov. 14, 2017 for U.S. Appl. No. 15/478,858, 22 pages.

Notice of Allowance dated May 30, 2018 for U.S. Appl. No. 15/478,858, 14 pages.

* cited by examiner

BRIDGE INTERCONNECTION WITH LAYERED INTERCONNECT STRUCTURES

RELATED APPLICATIONS

This application is a continuation application of U.S. patent application Ser. No. 15/478,858, entitled "BRIDGE INTERCONNECTION WITH LAYERED INTERCONNECT STRUCTURES", filed Apr. 4, 2017 which is a continuation application of U.S. patent application Ser. No. 14/836,906, entitled "BRIDGE INTERCONNECTION WITH LAYERED INTERCONNECT STRUCTURES", filed Aug. 26, 2015, now U.S. Pat. No. 9,640,485 which is a divisional application of U.S. patent application Ser. No. 13/903,828, entitled "BRIDGE INTERCONNECTION WITH LAYERED INTERCONNECT STRUCTURES", filed May 28, 2013, now U.S. Pat. No. 9,147,663, and claims priority to the Ser. Nos. 15/478,858, 14/836,906, and 13/903,828 applications. The disclosures of Ser. Nos. 15/478,858, 14/836,906, and 13/903,828 are hereby fully incorporated by reference.

FIELD

Embodiments of the present disclosure generally relate to the field of integrated circuits, and more particularly, to techniques and configurations for bridge interconnection with layered interconnect structures, in integrated circuit assemblies.

BACKGROUND

Embedded bridge interconnection may provide faster communication between processors and memory chips. Various dies may need to be attached to a substrate at the first level interconnection (FLI) to enable high performance computing (HPC). As dies continue to shrink to smaller dimensions, a finer pitch is generally needed between interconnect structures at the FLI level.

Providing a finer pitch for future computing devices may be challenging using present technologies. For example, presently, a mixed bump pitch between processor die and memory die, may make packaging and assembly very challenging and result in poor yield performance. FLI joint architecture that employs a solder paste printing (SPP) process may result in yield failures due to limitations to solder bump height and/or solder volume on the dies, which may result in non-contact opens and bump cracks, especially for smaller pitch areas of the FLI. Moreover, electromigration risk may be elevated due to copper (Cu) diffusion and organic solder preservative (OSP) surface finish used on a substrate side for FLI joint.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
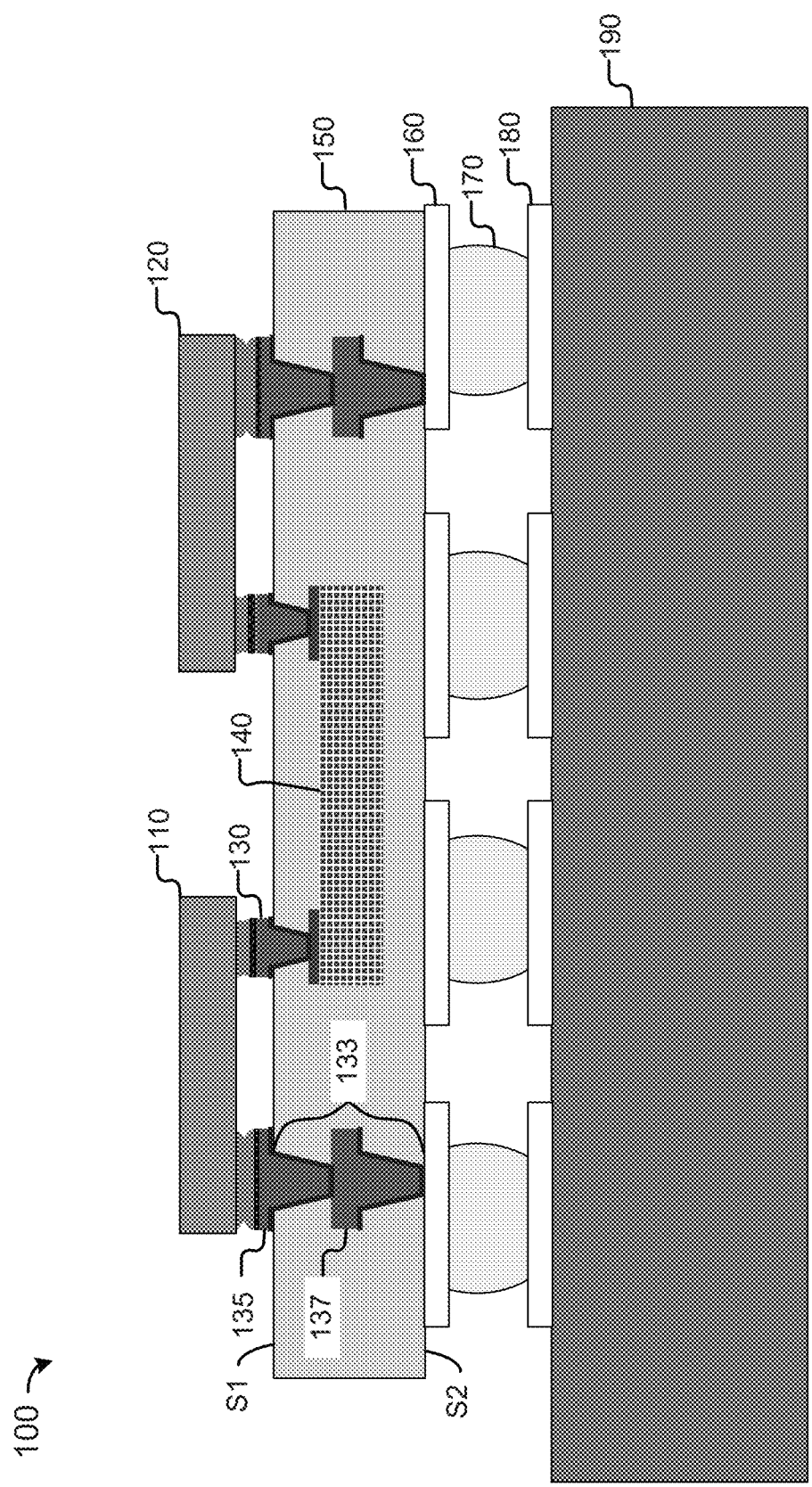
FIG. 1 schematically illustrates a cross-section side view of an example integrated circuit (IC) assembly configured to use embedded bridge interconnections with layered interconnect structures in a substrate, in accordance with some embodiments.

Embodiments of the present disclosure describe techniques and configurations for bridge interconnection with layered interconnect structures, in integrated circuit assemblies. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment", "in embodiments", or "in some embodiments" which may each refer to one or more of the same or different embodiments. Furthermore, the terms "comprising," "including," "having," and the like, as used with respect to embodiments of the present disclosure, are synonymous.

The term "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example IC assembly 100 configured to use embedded bridge interconnections with layered interconnect structures in a substrate, in accordance with some embodiments. In embodiments, IC assembly 100 may include one or more dies, such as die 110 and die 120, electrically and/or physically coupled with package substrate 150, as can be seen. Package substrate 150 may further be electrically coupled with circuit board 190, as can be seen. As used herein, first level interconnect (FLI) may refer to the interconnect between a die and a package substrate while second level interconnect (SLI) may refer to the interconnect between a package and a circuit board.

Die 110 or 120 may represent a discrete unit made from a semiconductor material using semiconductor fabrication techniques such as thin film deposition, lithography, etching and the like. In some embodiments, die 110 or 120 may include, or be a part of a processor, memory, SoC or ASIC. Die 110 and 120 can be attached to package substrate 150 according to a variety of suitable configurations including, a flip-chip configuration, as depicted, or other configurations such as, for example, being embedded in package substrate 150. In the flip-chip configuration, die 110 or 120 may be attached to a surface (e.g., side S1) of package substrate 150 using FLI structures such as interconnect structures 130, 135, which are configured to electrically and/or mechanically couple the dies 110, 120 with the package substrate 150 and route electrical signals between one or more of the dies 110, 120 and other electrical components. In some embodiments, the electrical signals may include input/output (I/O) signals and/or power/ground associated with operation of the dies 110, 120.

The interconnect structure 130 may be electrically coupled with the bridge 140 to route the electrical signals between the dies 110, 120 using the bridge 140. The interconnect structure 130 may, as discussed further below, substantially inhibit diffusion and mitigate electromigration risks and provide higher and more compliant FLI joint and standoff height, which may improve assembly performance, reduce assembly yield loss, and enhance FLI reliability.

The interconnect structure 135 may be configured to route the electrical signals between a die (e.g., die 110) and an electrical pathway 133 that passes through the package substrate 150 from a first side S1 to a second side S2 that is opposite to the first side S1. For example, the interconnect structure 135 may be coupled with other interconnect structures (e.g., interconnect structure 137) such as, for example, trenches, vias, traces, or conductive layers and the like that are configured to route electrical signals of the die 110 between the first side S1 and the second side S2 of the package substrate 150. The interconnect structure 135 may be part of the electrical pathway 133 in some embodiments.

The interconnect structure 137 is merely an example structure for the sake of discussion and may represent any of a variety of suitable interconnect structures and/or layers. Similarly configured interconnect structures 130 and 135 may couple the die 120 or other dies (not shown) with the package substrate 150. The package substrate 150 may include more or fewer interconnect structures or layers than depicted. In some embodiments, an electrically insulative material such as, for example, molding compound or underfill material (not shown) may partially encapsulate a portion of dies 110 or 120, and/or interconnect structures 130, 135.

In some embodiments, bridge 140 may be configured to electrically connect dies 110 and 120 with one another. In some embodiments, bridge 140 may include interconnect structures (e.g., interconnect structure 130) to serve as electrical routing features between the dies 110 and 120. In some embodiments, a bridge may be disposed between some dies on package substrate 150 and not between other dies. In some embodiments, a bridge may not be visible from a top view. Bridge 140 may be embedded in a cavity of package substrate 150 in some embodiments. Bridge 140 may be a high density routing structure that provides routes for electrical signals. Bridge 140 may include a bridge substrate composed of glass or a semiconductor material, such as high resistivity silicon (Si) having electrical routing interconnect features formed thereon, to provide a chip-to-chip connection between the dies 110 and 120. Bridge 140 may be composed of other suitable materials in other embodiments. In some embodiments, the package substrate 150 may include multiple embedded bridges to route electrical signals between multiple dies.

In some embodiments, package substrate 150 is an epoxy-based laminate substrate having a core and/or build-up layers such as, for example, an Ajinomoto Build-up Film (ABF) substrate. Package substrate 150 may include other suitable types of substrates in other embodiments including, for example, substrates formed from glass, ceramic, or semiconductor materials.

Circuit board 190 may be a printed circuit board (PCB) composed of an electrically insulative material such as an epoxy laminate. For example, circuit board 190 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures such as traces, trenches, vias may be formed through the electrically insulating layers to route the electrical signals of the die 110 or 120 through circuit board 190. Circuit board 190 may be composed of other suitable materials in other embodiments. In some embodiments, circuit board 190 is a motherboard (e.g., motherboard 1002 of FIG. 10).

Package-level interconnects such as, for example, solder balls 170 or land-grid array (LGA) structures may be coupled to one or more lands (hereinafter "lands 160") on package substrate 150 and one or more pads 180 on circuit board 190 to form corresponding solder joints that are configured to further route the electrical signals between the package substrate 150 and the circuit board 190. Lands 160 and/or pads 180 may be composed of any suitable electrically conductive material such as metal including, for example, nickel (Ni), palladium (Pd), gold (Au), silver (Ag), copper (Cu), and combinations thereof. Other suitable techniques to physically and/or electrically couple package substrate 150 with circuit board 190 may be used in other embodiments.

Figure 2:
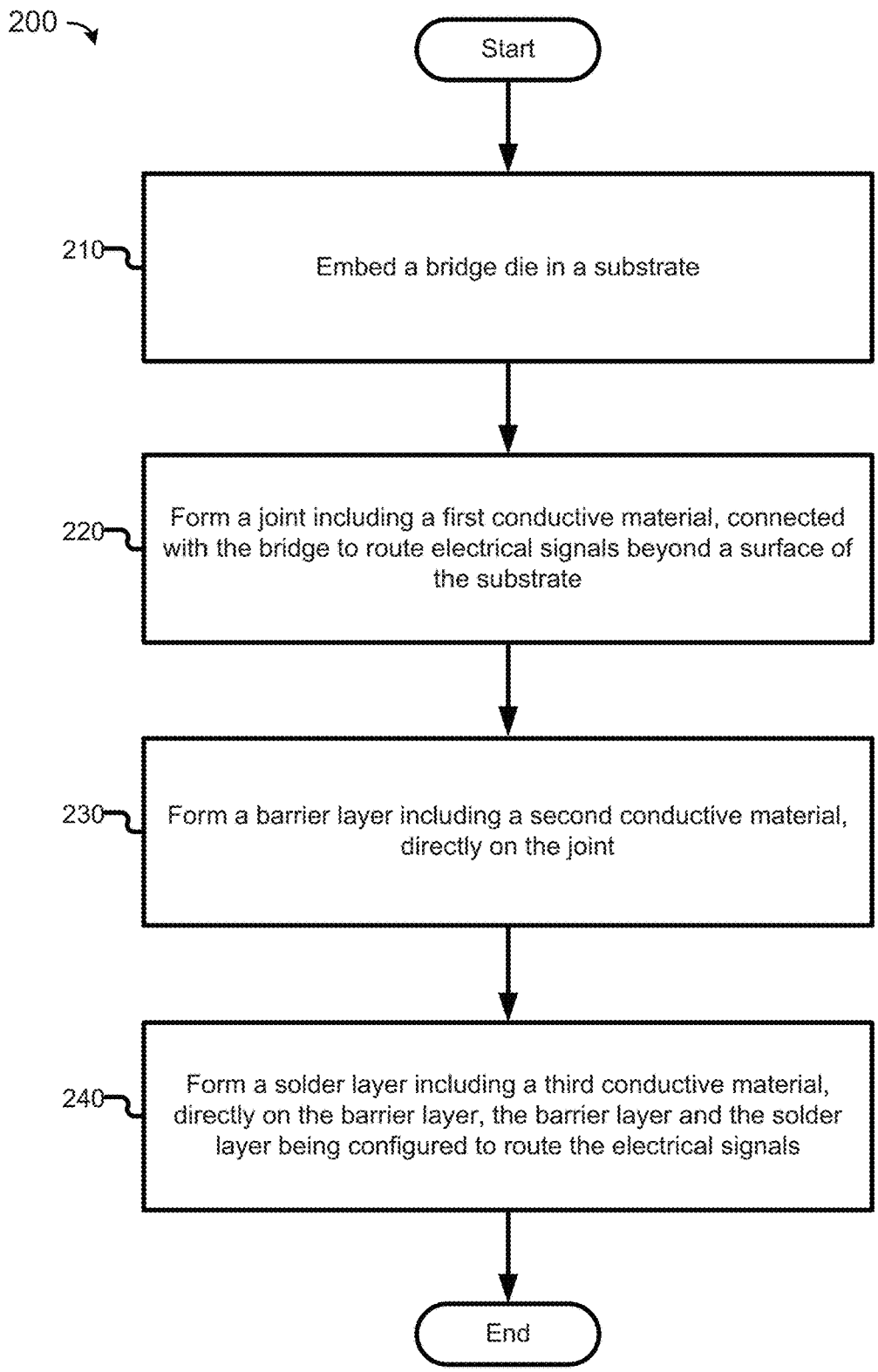
FIG. 2 schematically illustrates a flow diagram of a package substrate fabrication process for forming a substrate embedded with bridge interconnection using layered interconnect structures, in accordance with some embodiments.

FIG. 2 schematically illustrates a flow diagram of a package substrate fabrication process (hereinafter "process 200") for forming a substrate (e.g., package substrate 150 of FIG. 1) embedded with bridge interconnection using layered interconnect structures (e.g., interconnect structure 130 of FIG. 1), in accordance with some embodiments. The process 200 may comport with embodiments described in connection with FIGS. 3-8 according to various embodiments.

At 210, the process 200 may include forming a bridge (e.g., bridge 140 of FIG. 1) in a substrate. In embodiments, the bridge may be composed of glass or a semiconductor material (e.g., Si) and include electrical routing features to route electrical signals between dies. In some embodiments, the bridge may be disposed in or within a plane formed by one or more build-up layers of the substrate. For example, as can be seen in the depicted embodiment in connection with FIG. 1, bridge 140 is embedded in the build-up layers of substrate 150. In some embodiments, the bridge may be disposed in a plane formed by the build-up layers, but formed separately from the build-up layers.

In some embodiments, forming the bridge (e.g., bridge 140 of FIG. 1) disposed in a plane of the build-up layers may be performed by embedding the bridge in build-up layers as part of the formation of the build-up layers or by forming a cavity in the build-up layers and placing the bridge in the cavity subsequent to formation of the build-up layers, according to any suitable technique. The bridge may be embedded in the substrate during fabrication described in connection with FIGS. 3-5 according to various embodiments.

At 220, the process 200 may include forming a joint including a first conductive material, connected with the bridge to route electrical signals beyond a surface of the substrate. In embodiments, the joint may be a part of the interconnect structure (e.g., interconnect structure 130 of FIG. 1) that may electrically couple the bridge to a die. The joint may include the first electrically conductive material. In one embodiment, the first electrically conductive material may include Cu. In other embodiments, the first electrically conductive material may include other chemical compositions, or combinations thereof. In embodiments, the joint may include structures such as, for example, traces, trenches, vias, lands, pads or other structures that provide corresponding electrical pathways for electrical signals of a die through the package substrate to an embedded bridge, then, for example, to another die electrically coupled to the bridge. In one embodiment, the joint may include a via structure. In an embodiment, the joint may further include a pad structure coupled with the via structure. The joint may be formed during fabrication described in connection with FIG. 6 according to various embodiments.

At 230, the process 200 may include forming a barrier layer including a second conductive material, directly on the joint. In embodiments, the barrier layer may include the second electrically conductive material, such as a barrier metal, and be applied to cover the joint. The barrier layer may reduce or prevent diffusion of the first conductive material used in the joint into surrounding materials, while maintaining an electrical connection between the joint and a die. The second conductive material may have a different chemical composition than the first conductive material. The second electrically conductive material may include, for example, nickel (Ni), tantalum (Ta), hafnium (Hf), niobium (Nb), zirconium (Zr), vanadium (V), tungsten (W), or combinations thereof. In some embodiments, the second electrically conductive material may include conductive ceramics, such as tantalum nitride, indium oxide, copper silicide, tungsten nitride, and titanium nitride.

In embodiments, the barrier layer may mitigate the risk of electromigration. The risk of electromigration may increase with higher direct current densities when structure size in electronics such as integrated circuits (ICs) decreases. Electromigration may cause diffusion processes, such as grain boundary diffusion, bulk diffusion, or surface diffusion. In embodiments, when the first conductive material includes copper, surface diffusion may be dominant in copper interconnects caused by electromigration. The barrier layer may prevent copper diffusion between the neighboring copper and/or copper alloy lines. In one embodiment, electrolytic plating may be used to form the barrier layer. The barrier layer may be formed during fabrication described in connection with FIG. 7 according to various embodiments.

At 240, the process 200 may include forming a solder layer including a third conductive material, directly on the barrier layer, the barrier layer and the solder layer being configured to route electrical signals. In embodiments, the solder layer may include a third electrically conductive material, such as a fusible metal alloy, that is applied on the barrier layer. The solder layer may be used to join together the underlying structure including the barrier layer and the joint with a die via its connection points, while maintaining an electrical connection between the underlying structure and the die. In embodiments, the joint, the barrier layer, and the solder layer may collectively form an interconnect structure to route electrical signals between the bridge and a die.

In embodiments, the third conductive material may have a different chemical composition than the first and second conductive material. The third electrically conductive material may include, for example, tin (Sn), silver (Ag), nickel (Ni), zinc (Zn), or combinations thereof. The solder layer may be formed during fabrication described in connection with FIG. 7 according to various embodiments. In other embodiments, the solder layer may be formed by electrolytic plating, past printing, uball bumping, or other compatible processes.

Various operations are described as multiple discrete operations in turn, in a manner that is most helpful in understanding the claimed subject matter. However, the order of description should not be construed as to imply that these operations are necessarily order dependent. Operations of the process 200 may be performed in another suitable order than depicted. In some embodiments, the process 200 may include actions described in connection with FIGS. 3-8 and vice versa.

Figure 3:
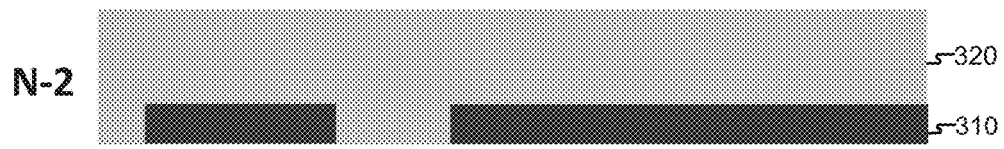
FIG. 3 schematically illustrates cross-sectional views of some selected operations, prior to embedding a bridge in a substrate, in connection with the package substrate fabrication process illustrated in FIG. 2, in accordance with some embodiments.
Figure 3:
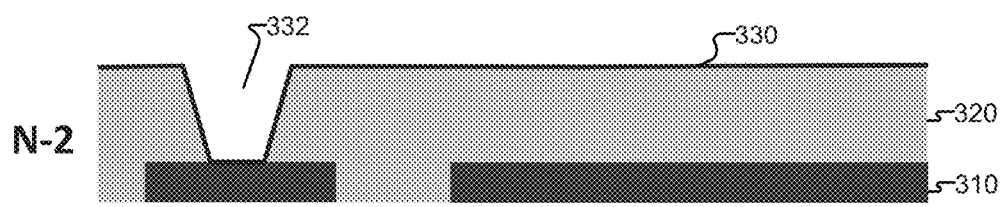
Figure 3:
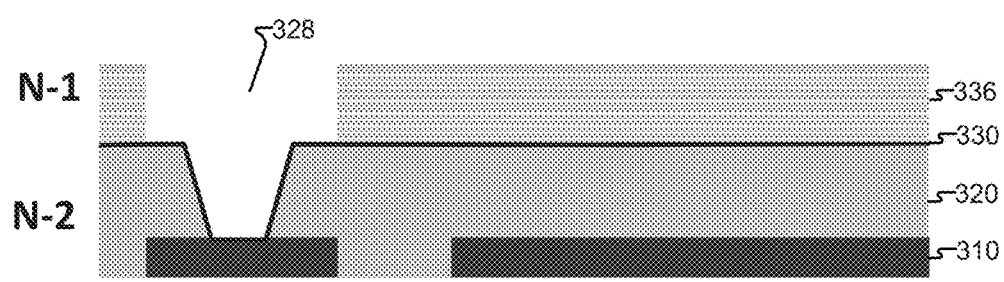

FIG. 3 schematically illustrate cross-sectional views of some selected operations, prior to embedding a bridge, in connection with the package substrate fabrication process 200 illustrated in FIG. 2, in accordance with some embodiments. Referring to operation 392, the substrate is depicted subsequent to forming a dielectric layer 320 over a patterned metal layer 310, as can be seen. In embodiments, the patterned metal layer and any number of layers below the patterned metal layer may be part of the substrate, and may be formed in any manner known in the art. For example, the patterned metal layer may be a top or outermost conductive layer of a build-up layer formed with a semi-additive process (SAP).

In embodiments, dielectric layer 320 may be composed of any of a wide variety of suitable dielectric materials including, for example, epoxy-based laminate material, silicon oxide (e.g., $SiO_2$), silicon carbide (SiC), silicon carbonitride (SiCN), or silicon nitride (e.g., SiN, $Si_3N_4$, etc.). Other suitable dielectric materials may also be used including, for example, low-k dielectric materials having a dielectric constant k that is smaller than a dielectric constant k of silicon dioxide. In embodiments, dielectric layer 320 may be formed by depositing a dielectric material using any suitable technique including, for example, atomic layer deposition (ALD), physical vapor deposition (PVD) or chemical vapor deposition (CVD) techniques. In embodiments, dielectric layer 320 may include a polymer (epoxy based resin) with silica filler to provide suitable mechanical properties that meet reliability requirements of the package. In embodiments, dielectric layer 320 may be formed as a film of polymer, such as by ABF lamination. Dielectric layer 320 may have a suitable ablation rate to enable laser patterning as described elsewhere herein.

Referring to operation 394, the substrate is depicted subsequent to forming cavity 332 on dielectric layer 320, as can be seen. In embodiments, cavity 332 may be a via hole which may be laser drilled into dielectric layer 320 to expose a portion of the patterned metal layer 310. Any conventional technique may be used, such as employing CO2 laser, to form cavity 332. In embodiments, a desmear process may be subsequently applied to remove smeared dielectric material, such as epoxy-resin, from the surface of the patterned metal layer 310, to prevent the smear residue to form another dielectric layer.

In embodiments, metallic seed layer 330 is then deposited on the top of the N-2 layer with any suitable techniques. In some embodiments, electroless plating may be used to form metallic seed layer 330. For example, a catalyst, such as palladium (Pd) may be deposited followed by an electroless copper (Cu) plating process. In some embodiments, a physical vapor deposition (i.e., sputtering) technique may be used to deposit metallic seed layer 330. Referring to operation 396, the substrate is depicted subsequent to forming a photosensitive layer such as, for example, a dry film resist (DFR) layer 336, as can be seen. In embodiments, DFR layer 336 may be laminated and patterned using any technique known in the art. In embodiments, opening 328 in DFR layer 336 may have bigger lateral dimensions than cavity 332, as can be seen.

Figure 4:
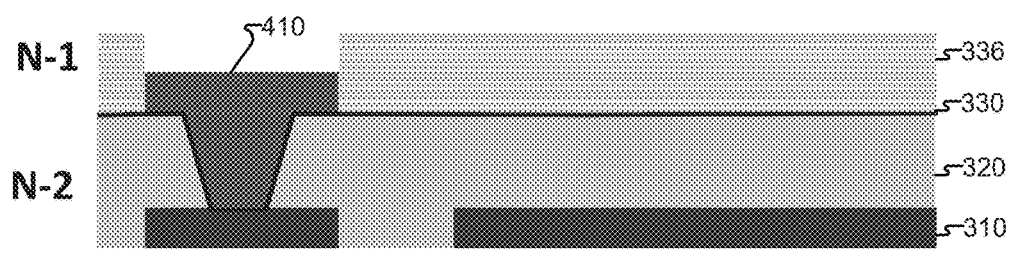
FIG. 4 schematically illustrates cross-sectional views of some other selected operations, prior to embedding a bridge in a substrate, in connection with the package substrate fabrication process illustrated in FIG. 2, in accordance with some embodiments.
Figure 4:
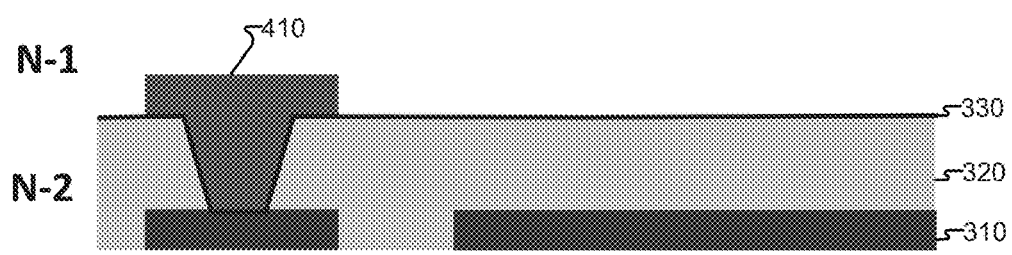
Figure 4:
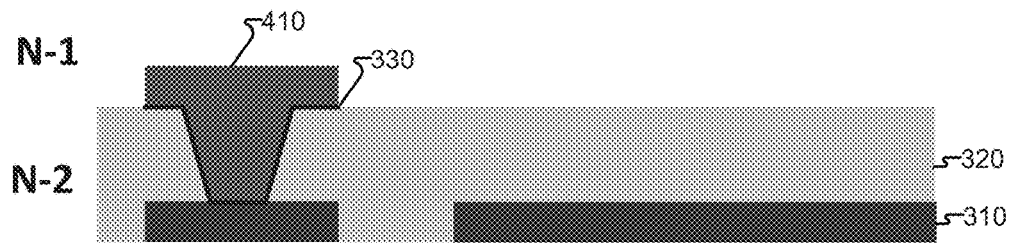

FIG. 4 schematically illustrates cross-sectional views of some other selected operations, prior to embedding a bridge, in connection with the package substrate fabrication process illustrated in FIG. 2, in accordance with some embodiments. Referring to operation 492, the substrate is depicted subsequent to depositing a conductive material into cavity 332 and opening 328, as can be seen. In embodiments, the conductive material may include the first electrically conductive material, as discussed above, such as metal including, for example, nickel (Ni), palladium (Pd), gold (Au), silver (Ag), copper (Cu), and combinations thereof. In embodiments, cavity 332 and opening 328 may be filled, for example, with an electrolytic plating process. In embodiments, an electrolytic copper plating process may be performed to fill cavity 332 and opening 328. In embodiments, interconnect structure 410 formed in operation 492 may protrude above the surface of the N-2 layer.

Referring to operation 494, the substrate is depicted subsequent to stripping DFR, as can be seen. In embodiments, the DFR may be removed using any conventional strip process. Referring to operation 496, the substrate is depicted subsequent to etching metallic seed layer 330, as can be seen. In embodiments, DFR stripping may further delineate interconnect structure 410 and expose the underlying dielectric layer 320.

Figure 5:
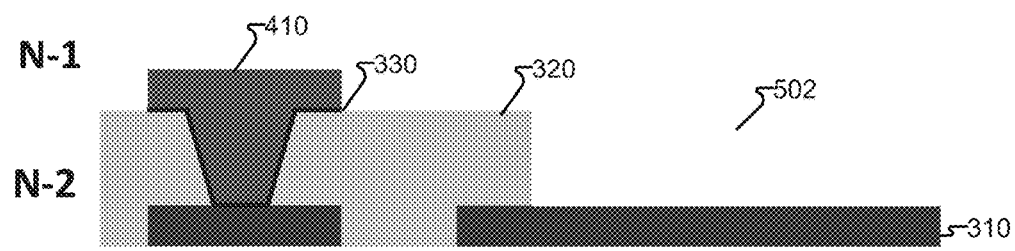
FIG. 5 schematically illustrates cross-sectional views of some selected operations to embed a bridge in a substrate, in connection with the package substrate fabrication process illustrated in FIG. 2, in accordance with some embodiments.
Figure 5:
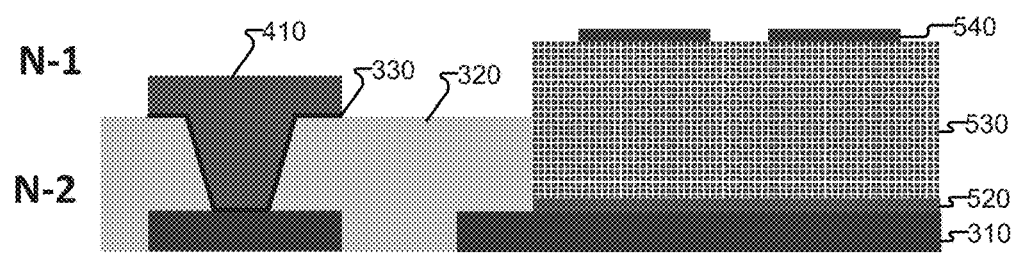
Figure 5:
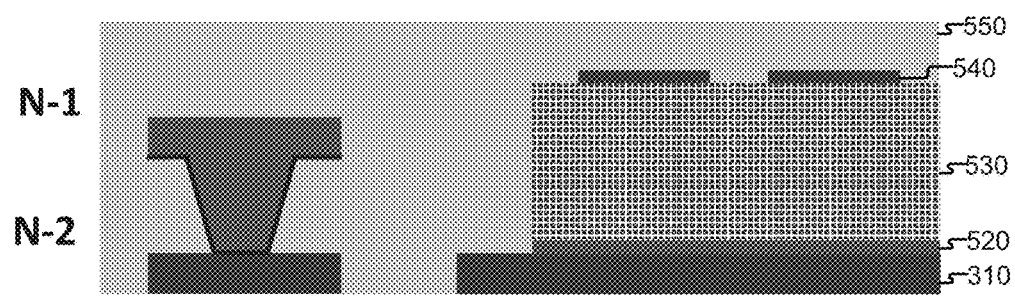

FIG. 5 schematically illustrates cross-sectional views of some selected operations to embed a bridge, in connection with the package substrate fabrication process illustrated in FIG. 2, in accordance with some embodiments. Referring to operation 592, the substrate is depicted subsequent to forming bridge cavity 502, as can be seen. In embodiments, bridge cavity 502 may be provided for placement of a bridge. In embodiments, at least a part of dielectric layer 320 may be removed by exposure to heat or chemicals to form bridge cavity 502. In embodiments, bridge cavity 502 may be laser drilled into dielectric layer 320 to expose a portion of the patterned metal layer 310. In other embodiments, bridge cavity 502 may be left open during fabrication of the previously discussed build-up layers. In yet other embodiments, bridge cavity 502 may be formed through the previously discussed build-up layers using a patterning process. For example, dielectric layer 320 may be composed of a photosensitive material that is amenable to masking, patterning and etching, or develop processes.

Referring to operation 594, the substrate is depicted subsequent to mounting bridge 530 (only showing a part of the bridge), as can be seen. In embodiments, bridge 530 may include a bridge substrate composed of glass or a semiconductor material, such as high resistivity silicon (Si) having electrical routing interconnect features formed thereon, to provide a chip-to-chip connection between dies. In embodiments, bridge 530 may be mounted on the patterned metal layer 310 using adhesive layer 520. The material of adhesive layer 520 may include any suitable adhesive configured to withstand processes associated with fabrication of the substrate. In embodiments, chemical treatments, such as copper roughing technique, may be applied to improve adhesion between bridge 530 and its surrounding surfaces. In embodiments, bridge 530 may have routing features 540, such as pads, protruding above the surface of the bridge substrate, and configured as connection points to route electrical signals to and from bridge 530.

Referring to operation 596, the substrate is depicted subsequent to forming dielectric layer 550 over bridge 530, thus substantially forming the N−1 layer on the N−2 Layer, as can be seen. In embodiments, dielectric layer 550 may be composed of any of a wide variety of suitable dielectric materials. In embodiments, dielectric layer 550 may be formed by depositing a dielectric material using any suitable technique including, for example, atomic layer deposition (ALD), physical vapor deposition (PVD) or chemical vapor deposition (CVD) techniques. In embodiments, dielectric layer 320 may include a polymer (e.g., epoxy-based resin) and may further include a filler (e.g., silica) to provide suitable mechanical properties that meet reliability requirements of the package. In embodiments, dielectric layer 320 may be formed as a film of polymer, such as by ABF lamination. Dielectric layer 550 may have a suitable ablation rate to enable laser patterning as described elsewhere herein.

Figure 6:
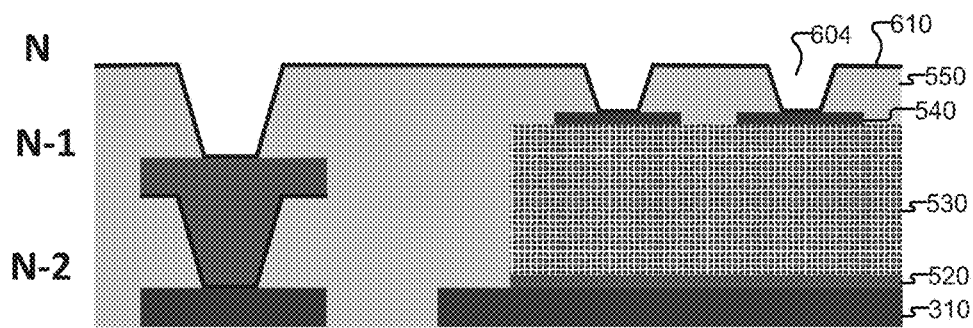
FIG. 6 schematically illustrates cross-sectional views of some selected operations to form a layered interconnect structure, in connection with the package substrate fabrication process illustrated in FIG. 2, in accordance with some embodiments.
Figure 6:
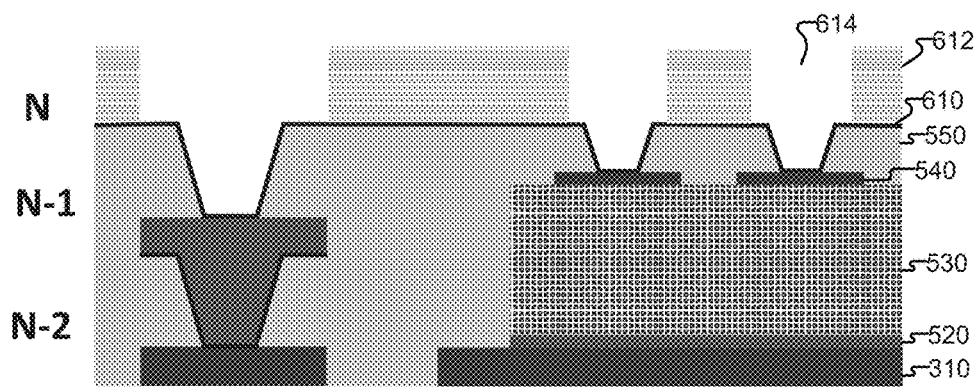
Figure 6:
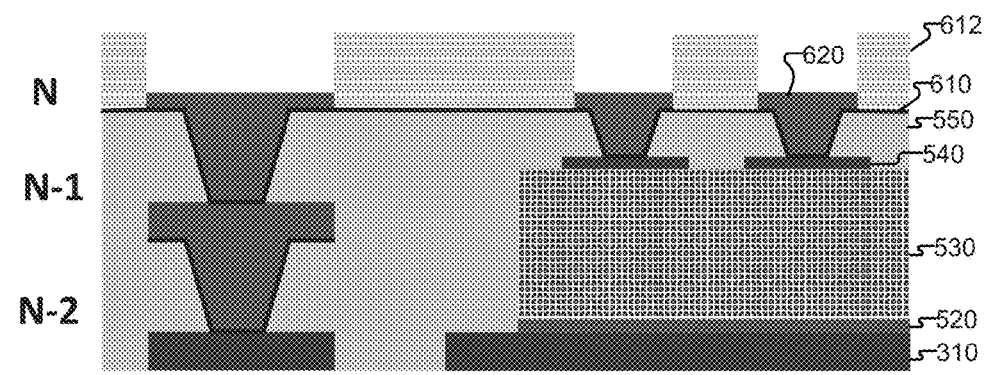

FIG. 6 schematically illustrates cross-sectional views of some selected operations to form a layered interconnect structure (e.g., interconnect structure 130 of FIG. 1), in connection with the package substrate fabrication process illustrated in FIG. 2, in accordance with some embodiments.

Referring to operation 692, the substrate is depicted subsequent to forming cavities 604 on dielectric layer 550, as can be seen. In embodiments, a cavity may be a via hole which may be laser drilled into dielectric layer 550 to expose a portion of the underlying routing features 540. Any conventional technique may be used, such as employing CO2 laser, to form cavities 604. In embodiments, a desmear process may be subsequently applied to remove smeared dielectric material, such as epoxy-resin, from the bottom surface of cavity 604, to prevent the smear residue to form another dielectric layer. In embodiments, metallic seed layer 610 is then deposited on the top of the N−1 layer with any suitable techniques. In some embodiments, electroless plating may be used to form metallic seed layer 610. For example, a catalyst, such as palladium (Pd) may be deposited followed by an electroless copper (Cu) plating process. In some embodiments, a physical vapor deposition (i.e., sputtering) technique may be used to deposit metallic seed layer 330.

Referring to operation 694, the substrate is depicted subsequent to forming a photosensitive layer such as, for example, dry film resist (DFR) layer 612, thus substantially forming the N layer on the N−1 Layer, as can be seen. In embodiments, DFR layer 612 is laminated and patterned using any technique known in the art. In embodiments, opening 614 in DFR layer 612 may have bigger lateral dimensions than cavity 604. In embodiments, operation 694 may be performed on both the top and bottom side (e.g., side S1 and S2 of FIG. 1) of the substrate.

Referring to operation 696, the substrate is depicted subsequent to depositing a conductive material into cavity 604 and opening 614, as can be seen. In embodiments, the conductive material may include the first electrically conductive material, as discussed above, such as metal including, for example, nickel (Ni), palladium (Pd), gold (Au), silver (Ag), copper (Cu), and combinations thereof. In embodiments, cavity 604 and the opening 614 may be filled, for example, with an electrolytic plating process. In embodiments, an electrolytic copper plating process may be performed to fill cavity 604 and opening 614 to form joint 620. At operation 696, over plated fill metal may be removed by one or more of, etching, buff grinding, chemical-mechanical polishing, etc. to planarize joint 620. For example, chemical, mechanical polishing (CMP) or buff grinding may be used to first planarize joint 620 and then etching may be employed to remove any remaining fill metal from the top surface of DFR layer 612. In embodiments, the interconnect structure or joint 620 formed in operation 696 may protrude above the surface of the N−1 layer (e.g., in the formation of a pad structure) and be configured to couple bridge 530 with dies.

In embodiments, other layered FLI interconnect structures (e.g., interconnect structure 135 of FIG. 1) may be formed in part by the operations of 692, 694, and 696.

Figure 7:
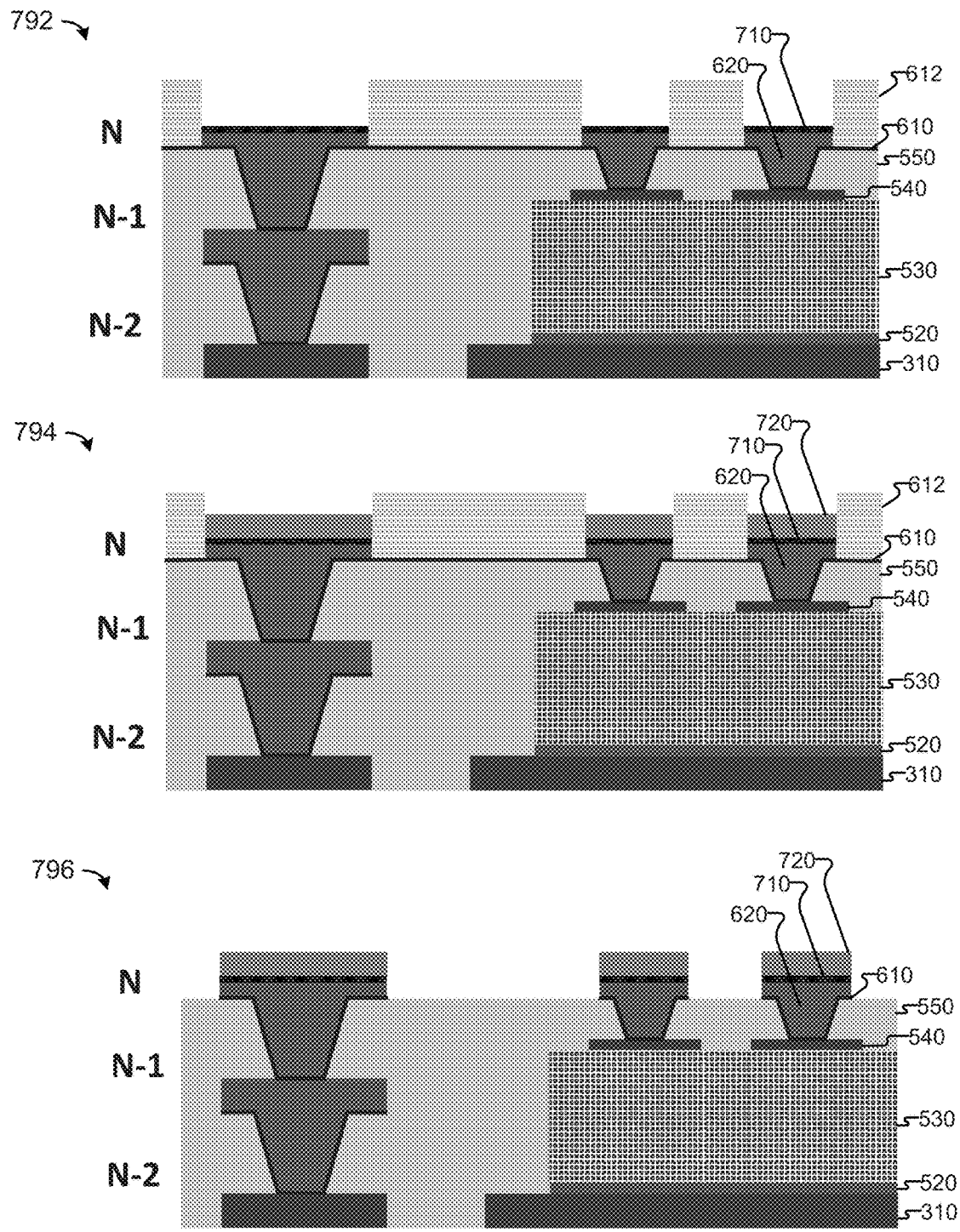
FIG. 7 schematically illustrates cross-sectional views of some other selected operations to form a layered interconnect structure, in connection with the package substrate fabrication process illustrated in FIG. 2, in accordance with some embodiments.

FIG. 7 schematically illustrates cross-sectional views of some other selected operations to form the layered interconnect structure, in connection with the package substrate fabrication process illustrated in FIG. 2, in accordance with some embodiments. Referring to operation 792, the substrate is depicted subsequent to forming barrier layer 710 directly on the joint, as can be seen. In embodiments, barrier layer 710 may include the second electrically conductive material, such as a barrier metal, and be applied to cover the joint. Barrier layer 710 may be configured to inhibit diffusion of the first conductive material used in the joint, while maintaining an electrical connection between the joint and a die. The second conductive material may differ with the first conductive material. The second electrically conductive material may include, for example, nickel (Ni), tantalum (Ta), tantalum nitride (TaN), titanium nitride (TiN), titanium tungsten (TiW), hafnium (Hf), niobium (Nb), zirconium (Zr), vanadium (V), or tungsten (W) and combinations thereof. In some embodiments, the second electrically conductive material may include conductive ceramics, such as tantalum nitride, indium oxide, copper silicide, tungsten nitride, and titanium nitride. Barrier layer 710 may be composed of multiple layers of different materials in some embodiments. In embodiments, operation 792 may include application of a protective film on the back side of the substrate.

Barrier layer 710 may be deposited using any suitable deposition technique. In some embodiments, one or more barrier materials of barrier layer 710 may be deposited using PVD technique. Barrier layer 710 may be formed using other suitable deposition techniques in other embodiments.

Referring to operation 794, the substrate is depicted subsequent to forming solder layer 720 directly on the barrier layer, as can be seen. In embodiments, solder layer 720 may include the third electrically conductive material, such as a fusible metal alloy, and be applied on barrier layer 710. In embodiments, the third conductive material may differ with the first and second conductive material. The third electrically conductive material may include, for example, tin (Sn), silver (Ag), nickel (Ni), zinc (Zn), and combinations thereof. In embodiments, solder layer 720 may be used to join together the underlying structure with a die and maintain an electrical connection between the underlying structure and the die. In embodiments, joint 620, barrier layer 710, and solder layer 720 may collectively form an interconnect structure to route electrical signals between bridge 530 and one or more dies, such as die 110 and 120 in connection with FIG. 1.

Referring to operation 796, the substrate is depicted subsequent to stripping DFR layer 612, as can be seen. In embodiments, DFR layer 612 may be removed using any conventional strip process. In embodiments, portions of metallic seed layer 610 may be removed, for example, by etching, so as to further delineate the interconnect structure. In some embodiments, the etch processes may include wet etching of metallic seed layer 610. Other suitable etch techniques or chemistries may be used in other embodiments. In embodiments, the protective film on the back side of the substrate may also be removed.

In embodiments, other layered FLI interconnect structures (e.g., interconnect structure 135 of FIG. 1) may be partially formed by the operations of 792, 794, and 796.

Figure 8:
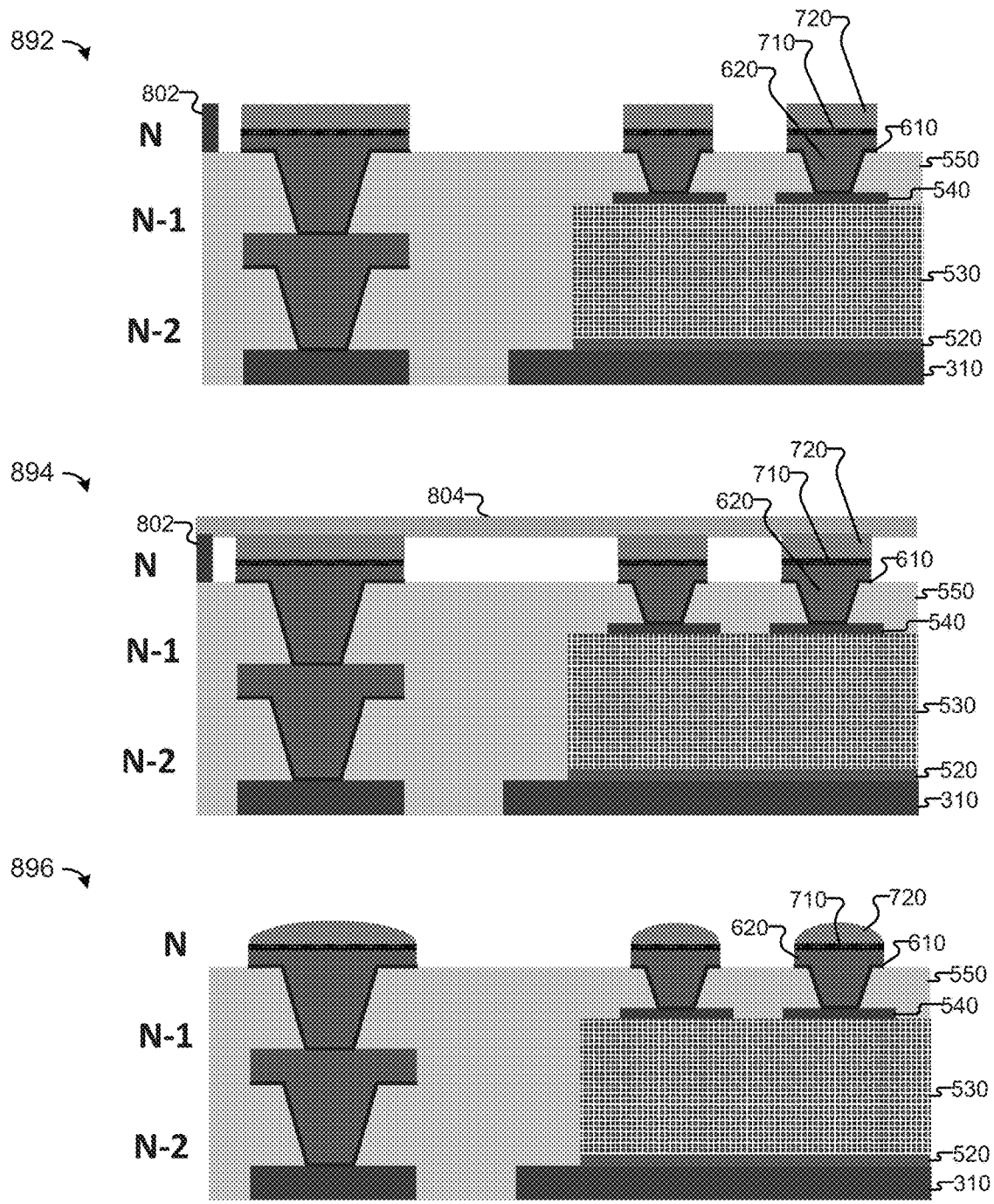
FIG. 8 schematically illustrates cross-sectional views of some selected operations to finalize a layered interconnect structure, in connection with the package substrate fabrication process illustrated in FIG. 2, in accordance with some embodiments.

FIG. 8 schematically illustrates cross-sectional views of some selected operations to finalize a layered interconnect structure, in connection with the package substrate fabrication process illustrated in FIG. 2, in accordance with some embodiments. Referring to operation 892, the substrate is depicted subsequent to exposing bump areas on a top side (e.g., side S1 of FIG. 1). In embodiments, a solder resist (SR) layer may be deposited on the dielectric layer 550. In embodiments, the SR layer may be patterned at non-bump area to cover traces or other electrical routing features, also form fiducial pad for assembly, for example pad 802. Subsequently, the bump area SR layer may be removed on a top side (e.g., side S1 of FIG. 1) of the substrate with techniques such as SR exposure or SR development. In other embodiments, the SR layer may be removed from the bump area using any suitable technique including, for example, patterning techniques such as etch and/or lithography. In embodiments, operation 892 may additionally include SR lamination and formation of solder resist openings (SROs) on the bottom (e.g., side S2 of FIG. 1) of the substrate (not shown).

Referring to operation 894, the substrate is depicted subsequent to forming protective film 804, as can be seen. The protective film 804 may protect components on the top (e.g., side S1 of FIG. 1) of the substrate during processing on the back (e.g., side S2 of FIG. 1) of the substrate. In embodiments, protective film 804 may be formed by any suitable technique, such as thin film deposition technique. In embodiments, a Nickel-Palladium-Gold (NiPdAu) lead surface finish (SF) may be applied on the back side of the substrate (not shown) while the protective film 804 is applied to the top of the substrate.

Referring to operation 896, the substrate is depicted subsequent to forming a round bump top on the interconnect structure, as can be seen. In embodiments, protective film 804 may be removed first, and then solder layer 720 may be reflowed into a round shape using a thermal process to elevate a temperature of the solder layer above a reflow temperature of the solder material.

In embodiments, other layered FLI interconnect structures (e.g., interconnect structure 135 of FIG. 1) may be partially formed by the operations of 892, 894, and 896.

Figure 9:
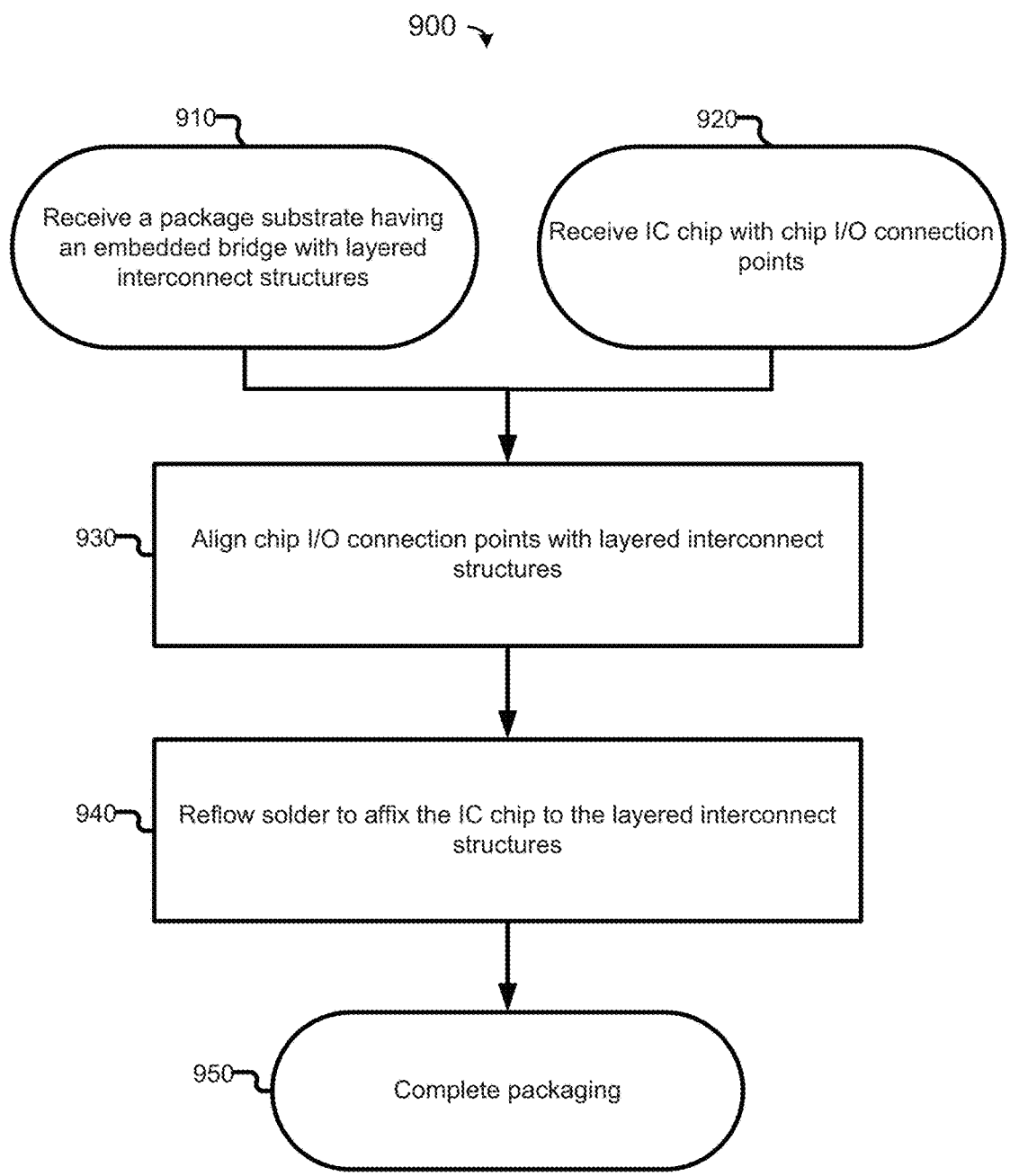
FIG. 9 schematically illustrates a flow diagram of an assembly process utilizing a package substrate with embedded bridge interconnections, in accordance with some embodiments.

FIG. 9 schematically illustrates a flow diagram of an assembly process 900 utilizing a package substrate with embedded bridge interconnections, in accordance with some embodiments. Such a package substrate may be produced through the illustrative processes described in reference to FIGS. 2-8 above.

Assembly process 900 begins at operation 910 with receiving a package substrate having an embedded bridge with layered interconnect structures (e.g., interconnect structure 130 of FIG. 1). The package substrate depicted in FIG. 8 may be used in the assembly process 900.

At operation 920, an IC chip may be received with chip I/O connection points (e.g., pads, bumps or pillars). While the IC chip may generally be of any conventional type, in some embodiments, the IC chip may be a processor, such as a microprocessor, having a large I/O count. In some embodiments the IC chip may be a memory die, having a large I/O count. In some embodiments, solder may be applied to the chip I/O connection points.

At operation 930, the IC chip may be aligned with the package substrate such that the soldered chip I/O connection points are aligned with the layered interconnect structures. Solderable material of the layered interconnect structures and/or solder on the chip I/O connection points is then reflowed at operation 940 to affix the IC chip to the layered interconnect structures. Additional operations may be performed to complete the packaging at 950. For example, in some embodiments, an electrically insulative material may be deposited to encapsulate or partially encapsulate the IC chip and/or the package substrate may be further coupled with a circuit board.

Figure 10:
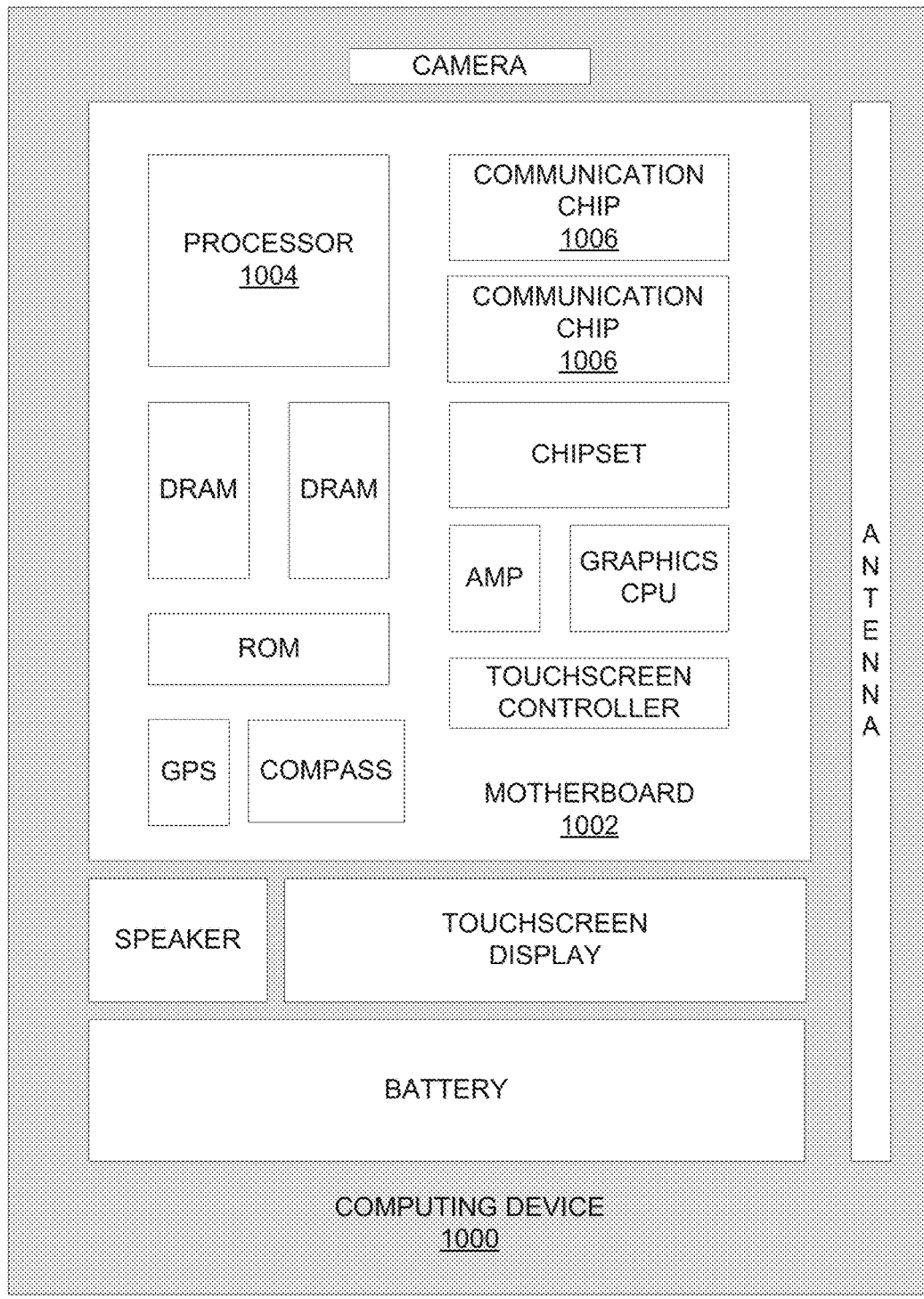
FIG. 10 schematically illustrates a computing device that includes embedded bridge interconnections with layered interconnect structures in a substrate as described herein, in accordance with some embodiments.

Embodiments of the present disclosure may be implemented into a system using any suitable hardware and/or software to configure as desired. FIG. 10 schematically illustrates a computing device that includes embedded bridge interconnections with layered interconnect structures in a substrate as described herein, in accordance with some embodiments. The computing device 1000 may house a board such as motherboard 1002. Motherboard 1002 may include a number of components, including but not limited to processor 1004 and at least one communication chip 1006. Processor 1004 may be physically and electrically coupled to motherboard 1002. In some implementations, the at least one communication chip 1006 may also be physically and electrically coupled to motherboard 1002. In further implementations, communication chip 1006 may be part of processor 1004.

Depending on its applications, computing device 1000 may include other components that may or may not be physically and electrically coupled to motherboard 1002. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

Communication chip 1006 may enable wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. Communication chip 1006 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 1006 may operate in accordance with other wireless protocols in other embodiments.

Computing device 1000 may include a plurality of communication chips 1006. For instance, a first communication chip 1006 may be dedicated to shorter range wireless communications such as Wi-Fi and Bluetooth, and a second communication chip 1006 may be dedicated to longer range wireless communications such as GPS, EDGE, GPRS, CDMA, WiMAX, LTE, Ev-DO, and others.

Processor 1004 of computing device 1000 may be packaged in an IC assembly (e.g., IC assembly 100 of FIG. 1) that includes a substrate (e.g. package substrate 150 of FIG. 1) having embedded bridges with layered interconnect structures as described herein. For example, circuit board 190 of FIG. 1 may be motherboard 1002, and processor 1004 may be die 110 coupled to package substrate 150 using interconnect structure 130 of FIG. 1. Package substrate 150 and motherboard 1002 may be coupled together using package level interconnects. The term "processor" may refer to any device or portion of a device that processes electronic data from registers and/or memory to transform that electronic data into other electronic data that may be stored in registers and/or memory.

Communication chip 1006 may also include a die (e.g., die 120 of FIG. 1) that may be packaged in an IC assembly (e.g., IC assembly 100 of FIG. 1) that includes a substrate (e.g. package substrate 150 of FIG. 1) having embedded bridges with layered interconnect structures as described herein. In further implementations, another component (e.g., memory device or other integrated circuit device) housed within computing device 1000 may include a die (e.g., die 110 of FIG. 1) that may be packaged in an IC assembly (e.g., IC assembly 100 of FIG. 1) that includes a substrate (e.g. package substrate 150 of FIG. 1) having embedded bridges with layered interconnect structures as described herein. According to some embodiments, multiple processor chips and/or memory chips may be disposed on a same package substrate and the embedded bridges with layered interconnect structures may electrically route signals between any two of the processor or memory chips. In some embodiments, a single processor chip may be coupled with another processor chip using a first embedded bridge and a memory chip using a second embedded bridge.

In various implementations, computing device 1000 may be a laptop, a netbook, a notebook, an Ultrabook™, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

EXAMPLES

According to various embodiments, the present disclosure describes an apparatus or integrated circuit assembly which may include a substrate, a bridge embedded in the substrate, the bridge being configured to route electrical signals between a first die and a second die; and an interconnect structure electrically coupled with the bridge. The interconnect structure may include a via structure including a first conductive material, the via structure being disposed to route the electrical signals through at least a portion of the substrate, a barrier layer including a second conductive material disposed on the via structure, and a solderable material including a third conductive material disposed on the barrier layer. The first conductive material, the second conductive material, and the third conductive material may have different chemical composition.

In embodiments, the bridge may further include a pad. The first conductive material may be in direct contact with the pad.

In embodiments, the via structure may protrude beyond a surface of an outermost build-up layer of the substrate.

In embodiments, the barrier layer may cover a surface of the via structure to inhibit diffusion of the first conductive material through the barrier layer.

In embodiments, the first die may include a processor, and the second die may include a memory die or another processor.

In embodiments, the electrical signals may be input/output (I/O) signals.

In embodiments, the bridge may include a semiconductor material including silicon (Si), and the substrate may include an epoxy-based dielectric material.

In embodiments, the bridge may be embedded in the substrate using ABF lamination.

In embodiments, the first conductive material may include copper (Cu); the second conductive material may include nickel (Ni); and the third conductive material may include tin (Sn).

According to various embodiments, the present disclosure describes of fabricating a packing substrate of an integrated circuit assembly. In some embodiments, the method includes embedding a bridge in a substrate, forming a joint including a first conductive material, connected with the bridge to route electrical signals beyond a surface of the substrate; forming a barrier layer including a second conductive material, directly on the joint; and forming a solder layer including a third conductive material, directly on the barrier layer. The barrier layer and the solder layer may be configured to route the electrical signals.

In embodiments, embedding the bridge in the substrate may further include forming a bridge cavity, placing the bridge in the bridge cavity, and laminating a dielectric material over the bridge.

In embodiments, forming the joint may further include forming a via cavity in the substrate, forming an opening in a photosensitive material over the via cavity, and depositing the first conductive material into the via cavity and the opening using a plating process.

In embodiments, forming the barrier layer may include depositing the second conductive material on the joint.

In embodiments, forming the solder layer may include depositing the third conductive material on the barrier layer.

In embodiments, the method may further include reflowing the solder layer to form a round bump.

In embodiments, the first conductive material may include copper (Cu); the second conductive material may include nickel (Ni); and the third conductive material may include tin (Sn).

According to various embodiments, the present disclosure describes a storage medium, having multiple instructions configured to cause a device, in response to execution of the instructions by the device, to practice any previously described method.

According to various embodiments, the present disclosure describes an apparatus for bridge interconnection having means to practice any previously described method.

According to various embodiments, the present disclosure describes a product fabricated by any previously described method.

According to various embodiments, the present disclosure describes a system or computing device including a first die and a second die; and a substrate with an embedded bridge and an interconnect structure. The bridge and the interconnect structure may be configured to route electrical signals between the first die and the second die.

The interconnect structure may include a via structure including a first conductive material, the via structure being disposed to route the electrical signals through at least a portion of the substrate, a barrier layer including a second conductive material disposed on the via structure, and a solderable material including a third conductive material disposed on the barrier layer. The first conductive material, the second conductive material, and the third conductive material may have different chemical composition.

In embodiments, the first conductive material may include copper (Cu); the second conductive material may include nickel (Ni); and the third conductive material may include tin (Sn).

In embodiments, the bridge may include a semiconductor material, the semiconductor material including silicon (Si). The substrate may include a dielectric material.

In embodiments, the first die may include a processor, and the second die may include a memory die or another processor.

In embodiments, the first die may include a memory die, and the second die may include another memory die or a processor.

In some embodiments, the system or computing device may further include a circuit board. The circuit board may be configured to route the electrical signals of the die and one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board. In some embodiments, the system or computing device is one of a wearable computer, a smartphone, a tablet, a personal digital assistant, a mobile phone, an ultra mobile PC, an Ultrabook™, a netbook, a notebook, a laptop, a desktop computer, a server, a printer, a scanner, a monitor, a set-top box, an entertainment control unit, a digital camera, a portable music player, or a digital video recorder.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
a substrate having a cavity;
a bridge embedded in the substrate cavity;
a dielectric material laminated over the bridge in the cavity;
a joint electrically coupled with the bridge, to route electrical signals beyond a surface of the substrate, wherein the joint includes a first conductive material;
a barrier layer including a second conductive material disposed directly on the joint, and
a solder layer that includes a third conductive material, disposed directly on the barrier layer, wherein the barrier layer and the solder layer are to route the electrical signals.

2. The apparatus of claim 1, wherein the joint comprises a via.

3. The apparatus of claim 1, wherein the solder layer comprises a substantially round bump, formed by a reflow of the solder layer.

4. The apparatus of claim 1, wherein the first conductive material comprises copper (Cu), the second conductive material comprises nickel (Ni), and the third conductive material comprises tin (Sn).

5. The apparatus of claim 1, further comprising:
a first die electrically coupled with the bridge; and
a second die electrically coupled with the bridge.

6. The apparatus of claim 5, wherein the first die includes a processor and the second die includes a memory die or another processor.

7. The apparatus of claim 1, wherein the electrical signals are input/output (I/O) signals.

* * * * *